United States Patent [19]

Yasuda

[11] 4,106,278

[45] Aug. 15, 1978

[54] ELECTRONIC TIMEPIECE UTILIZING SEMICONDUCTOR-INSULATING SUBSTRATE INTEGRATED CIRCUITRY

[75] Inventor: Hirofumi Yasuda, Suwa, Japan

[73] Assignee: Kabushiki Kaisha Suwa Seikosha, Tokyo, Japan

[21] Appl. No.: 642,047

[22] Filed: Dec. 18, 1975

[30] Foreign Application Priority Data

Dec. 18, 1974 [JP] Japan ................................ 49-146043

[51] Int. Cl.$^2$ .......................... G04C 3/00; H01L 27/02

[52] U.S. Cl. ................................ 58/23 A; 58/23 AC; 307/220 C; 328/16; 331/108 A; 331/108 C; 357/4; 357/42

[58] Field of Search ............... 58/23 R, 23 A, 23 AC, 58/23 D, 23 TF, 23 V, 50 R; 357/42, 4; 307/220 C, 225 C; 331/108 A, 108 C; 328/16, 39

[56] References Cited

U.S. PATENT DOCUMENTS

| | | | |
|---|---|---|---|
| 3,707,071 | 12/1972 | Walton | 58/50 R |
| 3,714,867 | 2/1973 | Dargent | 58/50 R |
| 3,737,746 | 6/1973 | Cielaszyk et al. | 58/23 AC X |
| 3,895,486 | 7/1975 | Hammer et al. | 58/23 R |
| 3,913,006 | 10/1975 | Fillmore | 58/23 A X |
| 3,922,844 | 12/1975 | Sakamoto | 58/23 R |
| 3,939,644 | 2/1976 | Wolf | 58/23 R |
| 3,945,194 | 3/1976 | Gollinger | 58/23 R |
| 3,958,266 | 5/1976 | Athanas | 357/4 X |

OTHER PUBLICATIONS

S. S. Eaton, Sapphire brings out the best in C-MOS, Electronics, Jun. 12, 1975, pp. 115-120.

*Primary Examiner*—Stanley J. Witkowski
*Attorney, Agent, or Firm*—Blum, Moscovitz, Friedman & Kaplan

[57] ABSTRACT

An electronic timepiece wherein the timekeeping circuitry utilizes semiconductor-insulating substrate integrated circuitry for effecting high frequency operation is provided. The timepiece includes an oscillator circuit adapted to produce a high frequency time standard signal and is comprised of at least one inverter stage coupled to a high frequency time standard. A divider circuit formed of a plurality of series-connected divider stages produces a low frequency timekeeping signal in response to the high frequency time standard signal being applied thereto. A display is provided for displaying time in response to the timekeeping signal being applied thereto. The oscillator circuit, divider circuit and display include integrated circuit elements and at least the inverter stage of the oscillator circuit includes at least one complementary coupled pair of P-channel and N-channel conductive field-effect transistors having a semiconductor-insulating substrate construction.

18 Claims, 13 Drawing Figures

ELECTRONIC TIMEPIECE UTILIZING SEMICONDUCTOR-INSULATING SUBSTRATE INTEGRATED CIRCUITRY

BACKGROUND OF THE INVENTION

This invention is directed to an electronic timepiece utilizing semiconductor-insulating substrate integrated circuitry, and in particular to utilizing semiconductor-insulating substrate integrated circuit elements in the oscillator circuit and high frequency stages of the divider circuit in an electronic timepiece to accomodate time standards able to oscillate at extremely high frequencies such as a thickness-shear quartz crystal vibrator.

Heretofore, electronic timepieces have been formed with metal-oxide semiconductor field effect transistors, hereinafter referred to as MOS-FETs, formed on a silicon wafer. Nevertheless, the manner in which such MOS-FETs are fabricated causes a considerable amount of parasitic capacitance to be generated during normal operation of such MOS-FETs. The greater the parasitic capacitance, the greater is the consumption of current required to charge and discharge the parasitic capacitance, such charging and discharging being determinative of the response speed in utilizing such transistors in high frequency operation. Accordingly, such MOS-FETs are less than completely satisfactory when utilized with quartz crystal vibrators capable of providing stable operation at extremely high frequencies, since the MOS-FETs are likely to dissipate excessive power and often are not able to operate at the switching speeds required.

SUMMARY OF THE INVENTION

Generally speaking, in accordance with the instant invention, an electronic timpiece utilizing semiconductor-insulating substrate integrated circuitry is provided. The timepiece includes an oscillator circuit having at least one inverter-amplifier stage coupled to a high frequency time standard, the oscillator circuit producing a high frequency time standard signal. A divider circuit includes a plurality of series-connected divider stages for producing a low frequency time signal in response to the high frequency time standard signal. A display displays time in response to receiving said timekeeping signal. The inverter stage, divider circuit and display include integrated circuit elements, at least the inverter stage of the oscillator circuit including at least one complementary coupled pair of P-channel and N-channel conductive field effect transistors having a semiconductor-insulating substrate construction.

Accordingly, it is an object of this invention to provide an improved electronic timepiece wherein semiconductor-insulating substrate integrated circuitry is utilized.

A further object of the instant invention is to provide an improved electronic timepiece wherein the oscillator circuit and high frequency portion of the divider circuit are formed of semiconductor-insulating substrate field effect transistors for reducing current consumption and improving reliability.

Still a further object of the instant invention is to provide electronic timepiece circuitry for minimizing current consumption when relatively high frequency time standards such as thickness-shear quartz crystal vibrators are utilized.

Still other objects and advantages of the invention will in part be obvious and will in part be apparent from the specification.

The invention accordingly comprises the features of construction, combinations of elements, and arrangement of parts which will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

In conventional small-sized electronic timepieces such as wristwatches, the timekeeping circuitry is comprised of three circuits, an oscillator circuit having a high frequency time standard, a divider circuit for dividing down a high frequency signal produced by the oscillator circuit and thereby producing low frequency timekeeping signals, and display circuitry intermediate the divider circuit and either an electro-mechanical display or digital display for processing the timekeeping signals and producing display signals for application to the appropriate display. The oscillator circuit is designed to have an extremely high Q. Heretofore, it has been the practice to integrate the entire divider circuit and any other timekeeping signal processing circuitry in a single chip. Thereafter, any frequency adjustment required to provide for accurate operation of the electronic timepiece was effected by changing the capacitance and/or resistence of the oscillator circuit to thereby change the frequency of vibration of the high frequency time standard and thereby tune the oscillator circuit.

Figure 1:
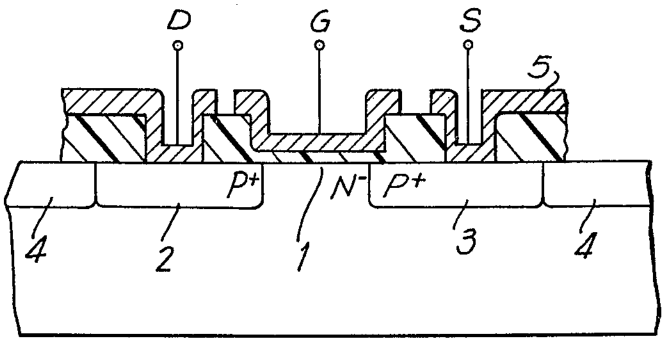
FIG. 1 PRIOR ART
FIG. 1 is a partial sectional view of a P-chennel MOS field effect transistor constructed in accordance with the prior art.

The divider circuit and other circuitry integrated into the circuit chip are formed of pairs of complementary coupled A1 gate metal oxide semiconductor field effect transistors, referred herein as MOS-FETs, which transistors are formed on a silicon wafer in the manner depicted in FIG. 1. When such complementary MOS circuits are utilized, if the supply voltage $V_{DD}$ is a little larger than the sum $V_{GT}$ of the total threshold voltages, $V_{GTN} + V_{GTP}$ of both channels, the consumption current of the complementary coupled MOS elements is the current required to charge and discharge the drain parasitic capacitance $C_D$, and accordingly, the response speed of the transistors is determined by the time required to charge and/or discharge the parasitic capacitance of the respective P-channel and N-channel complementary coupled transistors.

For example, referring to the construction illustrated in FIG. 1, the drain parasitic capacitance $C_D$ is comprised of the wiring capacitance $C_M$ between the substrate 1 and aluminum electrodes 5 utilized for defining the drain, source and gate terminals and the junction capacitance $C_J$ formed by the drain diffusion layer 2 and the substrate 1 and additionally between the drain diffusion layer 2 and gate capacitance $D_G$ of the adjacent transistor stage input portion. In the MOS transistor illustrated in FIG. 1, wherein a source 3 drain 2 and stopper 4 are formed by disposing diffusion layers in a substrate, the wiring capacitance $C_M$ and junction capacitance $C_J$ cannot be eliminated or lowered, and accordingly the parasitic capacitance $C_D$ is excessive. Thus, when a static divider circuit of the type illustrated in FIG. 3 wherein series connected complimentary coupled P-channel and N-channel transistors define transmission gates $TG_1$ through $TG_4$, and complementary P-channel and N-channel MOS-FETs are utilized to define the inverter-amplifier stages $I_1$ through $I_4$, a highly stable dividing operation is provided when same is operated at low frequencies by clock signal $\phi$ and the compliment thereof $\bar{\phi}$ in a conventional manner. However, as the high frequency range is approached, the charging and discharging required to effect responsive switching of the transistors causes a dramatic increase in current consumption and an inability to obtain a sufficient switching response at such high frequencies. Moreover, as the frequency increases, the time required to charge and discharge the respective transistors at the supply voltage $V_{DD}$ increases so that the circuit cannot respond in the input period and the operation of the circuit stops at a certain supply voltage.

Figure 2:
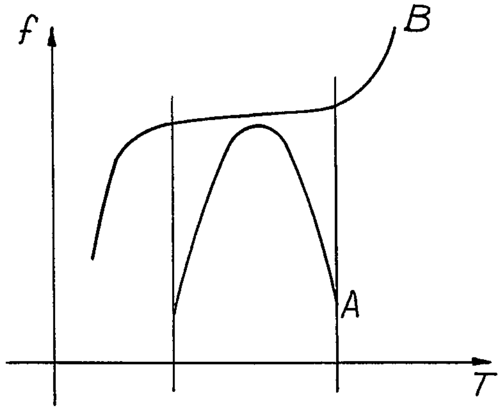
FIG. 2 is a graphical illustration of the natural frequency-temperature characteristic of a tuning fork quartz crystal vibrator and thickness-shear quartz crystal vibrator.
Figure 3:
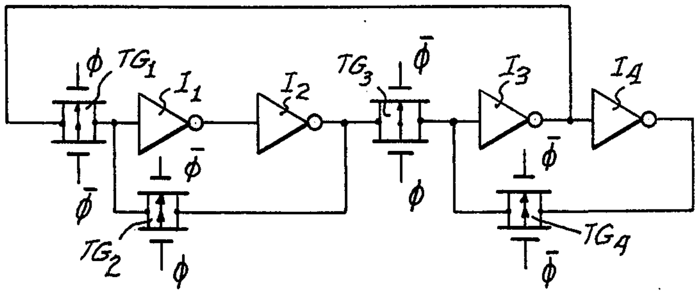
FIG. 3 PRIOR ART
FIG. 3 is a static divider circuit constructed in accordance with the prior art.

Since the power source utilized in small sized electronic timepieces is a low voltage battery having limited capacity in view of the small space provided for the power source, if the oscillator circuit utilizes a tuning fork quartz crystal vibrator having a low natural frequency, the battery is sufficient to effect driving of a static divider circuit of the type illustrated in FIG. 3 over a considerable period of time. Nevertheless, such tuning fork crystal vibrators experience considerable changes in their vibratory frequency in response to changes in temperature, the change of a tuning fork quartz crystal vibrator with respect to temperature being illustrated as curve A in FIG. 2. It is therefore necessary to compensate for the temperature characteristic of a quartz crystal vibrator by utilizing appropriate circuitry, such as a barium titanate capacitor, having a temperature characteristic corresponding to a quadradic curve. Nevertheless, when such a capacitance element is utilized to compensate for the temperature characteristic of the quartz crystal vibrator, fine tuning of the oscillator circuit to provide a highly accurate timepiece becomes costly and difficult. It is further noted that when a quartz crystal vibrator having an extremely high natural frequency and acceptable temperature characteristic such as thickness-shear quartz crystal vibrator is utilized as the oscillator circuit time standard, the static divider circuit illustrated in FIG. 3 will often not provide for stable operation, and even if stable operation can be achieved, the excessive current consumption caused thereby considerably shortens the battery life.

Figure 4:
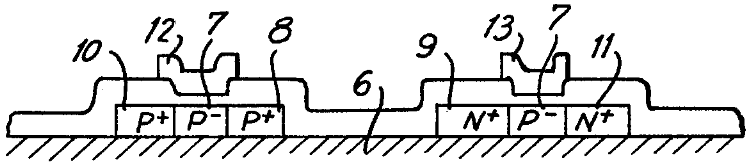
FIG. 4 is a partial sectional view of a depletion layer P-channel and inversion layer N-channel pair of conductive field-effect transistors having a semiconductor-insulating substrate construction.
Figure 5:
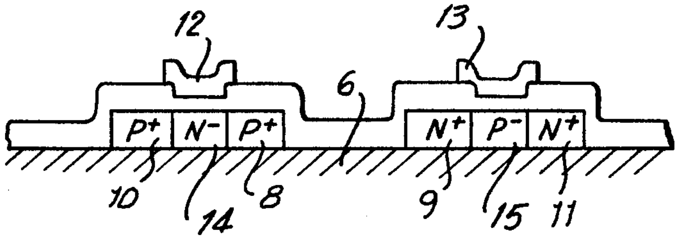
FIG. 5 is a partial sectional view of an inversion layer P-channel and N-channel pair of conductive field-effect transistors having a semiconductor-insulating substrate construction.

Reference is now made to FIGS. 4 and 5 wherein semiconductor-insulating substrate P-channel and N-channel field effect transistors, referred to herein, as semiconductor-insulating substrate transistors for use in the oscillator circuit and high frequency stages of the divider circuit and display output circuit are depicted. The transistors illustrated in FIGS. 4 and 5 are semiconductor structures wherein a monocrystalline silicon layer of about 1μ to 1.5μ in thickness is grown on a sapphire or spinel substrate 6. For example, on spinel substrate 6 are grown source and drain regions 10 and 8, respectively, of the P-channel transistor and drain and source regions 9 and 11, respectively, of the N-channel transistor, the gate electrode 12 and 13 of the P-channel and N-channel transistors and the remaining like elements in FIGS. 4 and 5 being denoted by like reference numerals. The transistors illustrated in FIG. 4 and 5 are semiconductor-insulating substrate constructions, referred to hereinafter as SIS constructions, for forming metal-insulating film-semiconductor transistors. As utilized herein the term semiconductor-insulating substrate refers to a semiconductor construction wherein the active regions are grown on an insulating substrate such as spinel, sapphire or the like, thereby resulting in no diffusion into the surface of the substrate so that adjacent conductive elements, spaced apart on the substrate, are ideally insulated with respect to each other.

The SIS construction illustrated in FIG. 4 includes a P-channel depletion control transistor and N-channel inversion layer control type transistor. The SIS transistor illustrated in FIG. 5 utilizes the semiconductor-insulating substrate construction and provides a P-channel and N-channel inversion layer control transistor.

In the semiconductor-insulating substrate constructions illustrated in FIGS. 4 and 5, the elements are separated by insulating substrate 6 and the relatively high capacitance characteristic and other deficiencies of the conventional MOS transistor is substantially avoided. Since the only conductive layer sharing a junction with the drains 8 and 9 are the low concentration regions 7, the breakdown voltage of the drain is elevated. Additionally, the parasitic transistors sometimes defined by the P-N junctions between adjacent MOS transistors is avoided since the insulating substrate is disposed under the A1 wiring, so that the distance between the respective elements is shortened. The source regions 10 and 11 drain regions 8 and 9 and channel regions 14 and 15 of the transistor illustrated in FIG. 5 are not formed as diffusion layers in a substrate so that the problem of undesired extension of the diffusion layers does not need to be considered. Accordingly, a chip formed from such semiconductor-insulating substrate elements can be reduced in size since the drains 8 and 9 and the low concentration regions 7 of the transistors are joined to each other over an extremely small area thereby minimizing the junction capacity $C_J$ of the drain regions. Also, the length of the A1 wiring is shortened and the drain capacitance is reduced to half that of the conventional drain capacitance $C_D$, which reduction includes the reduced wiring capacity C caused by such a transistor. Moreover, a decrease in the drain capacity carries with it a decrease by less than half of the current consumption over the MOS-FET structure illustrated in FIG. 1, and a sizable increase in the frequency at which the transistors can be sufficiently operated.

Figure 6:
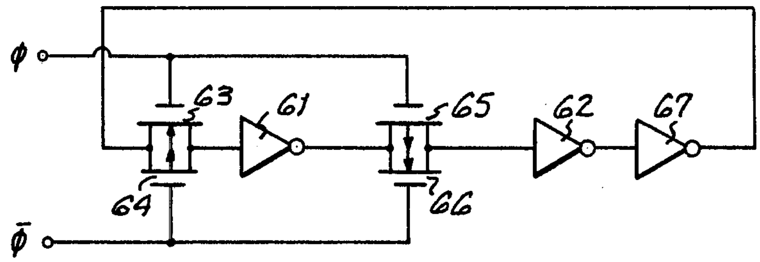
FIG. 6 is a circuit diagram of a dynamic divider circuit partially suitable for use in the high frequency portion of the divider circuit in accordance with the instant invention.

Reference is now made to FIG. 6, wherein a dynamic divider circuit for use with the transistors illustrated in FIGS. 4 and 5 is depicted. In FIG. 6, when clock signal $\phi$ is HIGH and clock signal $\overline{\phi}$ is LOW, series-connected transistors 63 and 64 defining a first transmission gate are turned ON, and series-connected transistors 65 and 66 defining a second transmission gate are turned OFF, thereby effecting an application of the binary condition of the output of the inverter 67 to the inverter 61. The binary condition of the output of inverter 67 is held by the parasitic capacitance of the drain of the C-MOS inverter 62 and the output of the inverter 61. Alternatively, when clock signal $\phi$ is LOW and clock signal $\overline{\phi}$ is therefore HIGH, transistors 63 and 64 are turned OFF and transistors 65 and 66 are turned ON so that the binary output of inverter 67 is applied to the input of C-MOS inverter 62. At such time, the binary condition of the output of the inverter 61 is held by the parasitic capacitance of the drain of the C-MOS inverter 61. Thus, the binary condition at the outputs of the inverters 61 and 67 are held by the extremely small parasitic capacitance if the input resistance of the C-MOS inverters 61 and 62 are of a high level (an infinite impedance being ideal) and where the current on the drain leads of the respective C-MOS inverters is kept small. Thus, by forming the P-channel and N-channel transistors comprising the inverter and transmission gate circuitry of semiconductor-insulating substrate elements, high frequency operation heretofore unavailable utilizing bulk silicon fabrication techniques is obtainable. If a supply voltage $V_{DD}$ of 1.5V is utilized, and the A1 gate MOS-FETs having the bulk silicon structure illustrated in FIG. 1 are utilized, the frequency at which the circuit depicted in FIG. 6 will cease operating is on the order of 500 KHz. However, when A1 gate semiconductor-insulating substrate transistors of the type illustrated in FIGS. 4 and 5 are utilized in the dynamic divider circuit illustrated in FIG. 6, the dynamic divider circuit can operate at frequencies as high as 5 MHz.

Figure 7:
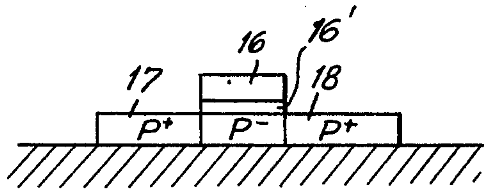
FIG. 7 is a partial sectional view of a self-alignment semiconductor-insulating substrate SOS construction.

Referring to FIG. 7, a self-aligning silicon gate having an SOS structure is depicted. As utilized herein the term SOS refers to semiconductor on insulating substrate devices and, in particular, to silicon on sapphire or silicon on spinel semiconductor-insulating substrate devices. The polycrystalline silicon 16 and silicon oxide film 16′ define a gate region, whereafter the source region 17 and drain region 18 are formed by diffusion, using the gate electrode as a diffusion mask. By forming a semiconductor-insulating substrate transistor in such a manner, the respective gate, drain and source regions overlap each other only in the transverse direction of diffusion, thereby decreasing the parasitic capacitance still further. Accordingly, the dynamic divider circuit depicted in FIG. 6 would operate up to a frequency of 10 MHz with transistors of the type illustrated in FIG. 7 utilized therein. Moreover, the dynamic divider circuit in FIG. 6 utilizing the transistors respectively depicted in FIG. 1, FIGS. 4 and 5 and FIG. 7 when operated at 1 MHz will provide a current consumption of 10 μA, 0.8 μA and 0.5 μA, respectively, thereby illustrating that the high-frequency characteristic is particularly beneficial in the semiconductor-insulating substrate structure and in particular the self-aligned gate SOS structure. Accordingly, the instant invention is characterized by utilizing the transistor structures illustrated in FIGS. 4 and 5 and FIG. 7 to raise the frequency at which the divider circuit can operate when driven by a 1.5 V battery found in an electronic wristwatch.

Such transistors make it possible to utilize a thickness-shear quartz crystal vibrator as a time standard in the oscillator circuit. Thickness-shear quartz-crystal vibrators, as illustrated by curve B in FIG. 2, have extremely good temperature characteristics in the temperature range from 0° C to 40° when utilized in a wristwatch. Accordingly, by utilizing semiconductor-insulating substrate transistors in the oscillator circuit and in the high frequency portion of the divider circuit, high frequency operation is obtained without any increase in power consumption.

Figure 8:
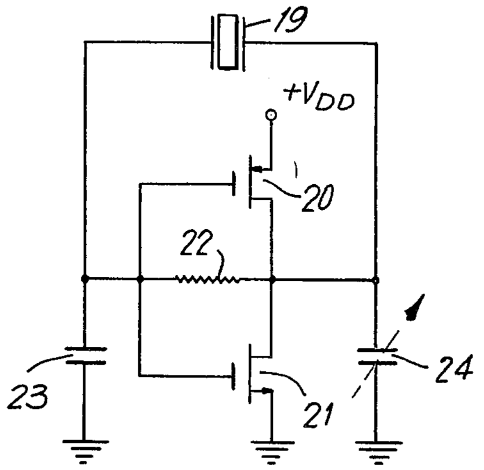
FIGS. 8, 9 and 10 are detailed circuit diagrams of oscillator circuits utilizing semiconductor-insulating substrate P-channel and N-channel transistors in accordance with the instant invention.
Figure 9:
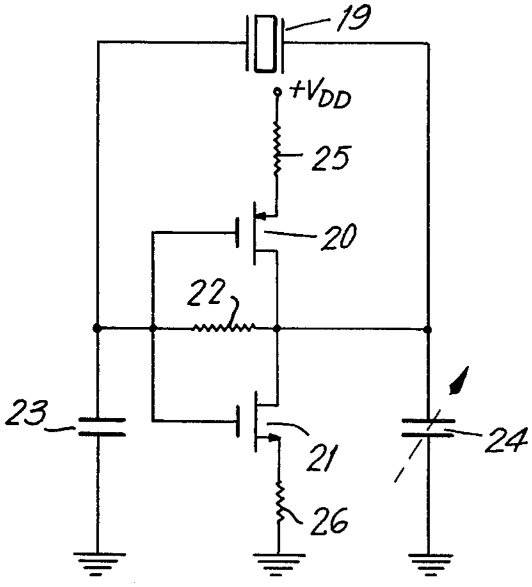
Figure 10:
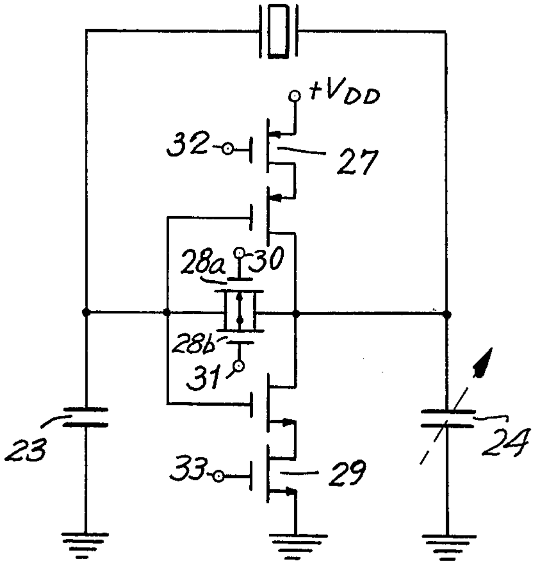

Reference is now made to FIGS. 8, 9 and 10 wherein oscillator circuits utilizing a thickness-shear quartz crystal vibrator 19 and an inverter-amplifier stage comprised of a pair of complementary coupled semiconductor-insulating substrate transistors 20 and 21 is depicted. A feed-back resistor 22 is coupled in parallel with the vibrator with the vibrator 19 across the drain and gate terminals of the transistors 20 and 21. Accordingly, as is illustrated in FIG. 10, in place of the feedback resistor 22, an equivalent resistance can be provided by utilizing MOS transistors 28*a* and 28*b*, the respective gate terminals 30 and 31 thereof being coupled to the battery. Moreover, the transistors utilized to provide the equivalent feed-back resistance may be formed by diffusing a low-concentration layer into a monocrystalline silicon substrate or by forming a polycrystalline silicon layer which is preferably doped on a semiconductor substrate such as monocrystalline silicon.

Additionally, source resistors 25 and 26 illustrated in FIG. 9 are coupled between the respective source terminals of the transistors 20 and 21 and the power source terminals and are utilized to reduce the current consumption and increase the stability at which the vibrator vibrates. As illustrated in FIG. 10, the resistors 25 and 26 can be replaced with MOS transistors 27 and 29 respectively, with the gate electrodes 32 and 33 respectively of transistors 27 and 29 being coupled to the power source terminals. Accordingly, each of the resistances in the oscillator circuit can be provided by using MOS transistors instead of a resistor.

Each of the oscillator circuits depicted in FIGS. 8, 9 and 10 require gate and drain capacitances to be coupled between the respective gate and drain terminals and one of the power source terminals to stabilize the operation of the oscillating circuit. In lieu of capacitors, the capacitance can be provided by utilizing an MOS structure on the same substrate as the remaining circuit elements integrated in the circuit chip and utilizing the inherent capacitance of the MOS transistor element. Moreover, the oscillator circuits are coupled to a divider circuit in such a manner that the output capacitance of the oscillator circuit can be utilized to define the input capacitance of the divider circuit. In such a case, either the gate terminal or drain terminal can be selected as the output terminal of the oscillator circuit. Accordingly, the drain capacitance 23 and the gate capacitance 24 would be coupled to the inverter-amplifier for reducing the current consumption and stabilizing the operation of the oscillator circuit. Moreover, since the capacitance of the first divider stage is summed with the output terminal capacitance of the oscillator circuit, substantially no change in current consumption is effected by the addition of a divider circuit. Moreover, these results are particularly obtained when the division ratio of the first divider stage comprising the divider circuit is large.

In light of the above, it is noted that each of the circuit elements in the oscillator circuit, other than the quartz crystal vibrator can be integrated on the same chip. Accordingly, if the semiconductor-insulating substrate and SOS techniques discussed above are utilized, the stray capacitances due to the connection of each element are substantially eliminated thereby reducing the current consumption of the oscillator circuit. Moreover, destabilizing influences such as temperature changes and the like are avoided, and the oscillator circuit is readily incorporated into the electronic timepiece. In a practical embodiment, when the resistance between the source electrode and power source is at a minimum or 0 ohms, and the supply voltage $V_{DD}$ produced by the timepiece power source is 1.60V, an oscillating current of 2$\mu$A to 3$\mu$A is consumed. However, when the resistance between the source electrode and power source is 50 K ohms, the oscillating current causes about 1.5 $\mu$A current consumption. Accordingly, even if the current consumed in the divider circuit and other circuits are included, a total current consumption of approximately 4.0 $\mu$A is achieved, which current consumption is extremely reduced considering the high frequency operation of the circuit.

It is noted that the oscillator circuits discussed above are able to provide a highly accurate extremely high frequency based time signal, but it is extremely difficult to effect adjustment of the high frequency time standard signal produced thereby. For example, in the case where the gate and/or drain capacitances of the inverter stage in the oscillator circuit include variable tuning capacitors 24, the current consumption rapidly increases and the stability of the circuit decreases as the capacitance is varied. Additionally, the oscillator circuit can include a variable tuning capacitor intermediate the vibrator and the commonly coupled drain and gate terminals or the tuning capacitor can be placed in parallel with quartz crystal vibrator. Nevertheless, it is difficult and expensive to utilize the natural frequency of the quartz crystal vibrator effectively.

In accordance with the instant invention, it is preferred to effect frequency adjustment by changing the division ratio of the divider circuit when the semiconductor-insulating substrate integrated circuit structure detailed above is utilized, so that no diminishing of the yield or increase in the chip size results. Specifically, even if considerable circuitry is utilized to adjust the frequency, there is no increase in size of the circuit chip and moreover, if no moving elements or variable capacitance elements are needed, the reliability of the electronic timepiece is improved.

Figure 11:
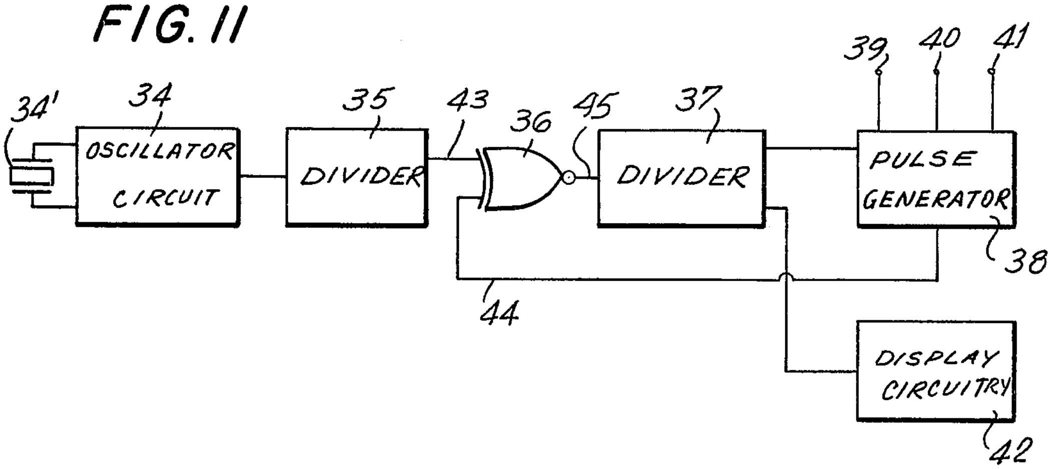
FIG. 11 is a block circuit diagram of an electronic timepiece including semiconductor-insulating substrate integrated circuitry in accordance with an alternate embodiment of the instant invention.
Figure 12:
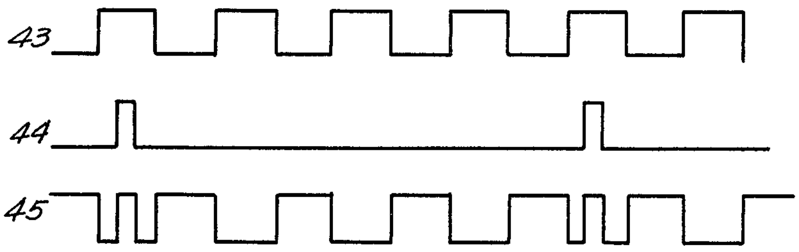
FIG. 12 is a timing diagram of the operation of the electronic timepiece depicted in FIG. 11.

Reference is now made to FIGS. 11 and 12 wherein a first frequency adjustment circuit and timing diagram therefor are respectively depicted. The oscillator circuit

34 is of the type discussed above with respect to FIGS. 8, 9 and 10 and includes a thickness-shear quartz crystal vibrator as a time standard. A divider circuit 35 is adapted to receive the high frequency time standard signal produced by the oscillator circuit and apply an intermediate frequency 43 to a first input of EXCLUSIVE NOR gate 36. The output of EXCLUSIVE NOR gate 36, when a "0" state signal 44 is applied to the second input thereof, is a signal having the same frequency as the intermediate frequency signal 43 with the phase thereof inverted. A further divider 37 divides down the signal 45 and applies same to a display circuit 42, which circuit processes the timekeeping signals produced by divider 37 and applies them to an appropriate display. Additionally, the timekeeping signals produced by divider 37 are applied to a pulse generator 38 having a plurality of input terminals 39 through 41. The pulse generator 38 is adapted to produce a correction signal of which pulse 44 is an example. By referencing each of the respective input terminals 39, 40 and 41 of the pulse generator 38 to a positive or negative potential, such as by bonding the terminals to a portion of the circuitry so referenced, selection of a "1" or "0" binary input is effected, which in turn determines, through the gating circuitry of pulse generator 38, the number of pulses 44 produced during each period of the output signal of divider 37.

As illustrated in FIG. 12, each application of a pulse 44 to the EXCLUSIVE NOR gate 36 causes the output signal 45 to equal the intermediate frequency signal 43 with an additional pulse added thereto for each pulse 44. Accordingly, the frequency is increased by one cycle for each pulse 44 applied by the pulse ganerator 38. The division ratio of the divider 37 is thus effectively varied by selectively connecting the input terminals 39 through 41 to either the HIGH or LOW side of the electronic timepiece power source. Moreover, the periodic occurrence of applying the pulses 44 is determined by the frequency of the timekeeping signal produced by divider 37 and applied to the pulse generator 38. Accordingly, frequency regulation is effected by circuitry which is readily integrated into the same circuit chip as the divider circuitry, oscillator circuitry and display circuitry it is noted that the higher frequency series-connected divider stages $FF_1$ through $FF_k$, can be formed of the dynamic divider stages depicted in FIG. 6 and define a high frequency portion series-coupled to a low frequency portion including the lower frequency series-connected divider stages $FF_{k+1}$ through $FF_n$ formed of the static divider stages depicted in FIG. 3.

Figure 13:
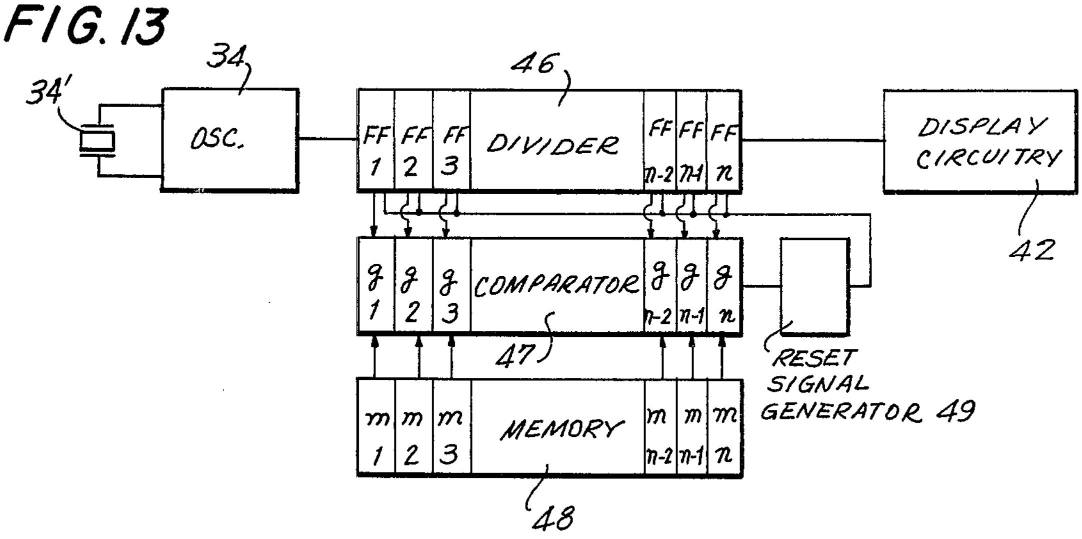
FIG. 13 is a block circuit diagram of a further electronic timepiece including semiconductor-insulating substrate integrated circuitry constructed in accordance with still another embodiment of the instant invention.

Reference is also made to FIG. 13 wherein a further embodiment of a division ratio circuit particularly suitable for use with the instant invention is depicted, like reference numerals being utilized to denote like elements depicted in FIG. 11. A divider 46 comprised of a plurality of series-connected divider stages $FF_1$ through $FF_n$ is adapted to receive the high frequency time standard signal produced by the oscillator 34 and apply same to the display circuitry 42. A memory circuit is adapted to select the division ratio for the divider circuit 46 by storing information representative of the binary count of the divider 46 that represents the frequency adjustment desired. Accordingly, the memory comprised of stages $M_1$ through $M_n$ is set by an externally applied standard signal which determines the binary count for the exact period of time. The time-keeping signal produced by each divider stage $FF_1$ through $FF_n$ is applied to an associated stage $g_1$ through $g_n$ of a comparator 47. When the outputs from each of the divider stages $FF_1$ through $FF_n$ are coincident with the binary state stored in each associated memory stage $M_1$ through $M_n$, the comparator circuit 47 actuates reset signal generator 49, which signal generator in turn resets each of the divider stages $FF_1$ through $FF_n$ to once again cause same to begin counting. For example, if the divider 46 is in an addition counting mode, then the divider counts from a count of 0, 0, . . . 0 to a count of 1, 1, . . ., 1. Accordingly, if the output signal produced by the divider is retarded, i.e., has a lower frequency than is required, if the divider is permitted to count through an entire cycle from 0, 0, . . ., 0 to 1, 1, . . ., 1, the time displayed by the display will be retarded. Accordingly, by setting the memory circuit to the binary count of the divider 46 representative of an accurate period for the output of divider 46, comparator 47 will produce an output signal and effect resetting thereof at such count, and effective frequency regulation is obtained. Accordingly, once during each count of the divider 46, the reset operation is repeated. It is noted that the binary count stored in memory 48 can be stored by utilizing electromagnetic induction and other known means. Accordinly, such an electronic timepiece can provide highly accurate operation and avoids changes in the oscillating frequency due to stray capacitances occurring during the assembly of the timepiece. Moreover, the amount of adjustment of the frequency is determined by one-half the period of the first stage divider circuit $FF_1$ and accordingly, when an extremely high frequency quartz crystal vibrator such as a thickness-shear vibrator is used, each of the divider stages can be utilized to obtain a resolution equal to one-half the period of the highest frequency divider stage $FF_1$.

Accordingly, the instant invention is characterized by each of the elements in the oscillator circuit, with the exception of the quartz crystal vibrator, the entire divider circuit and the display circuit utilized to process signals for driving an electro-mechanical transducer or energizing a digital display is integrated in a single circuit chip, so that the quartz crystal oscillator circuit has a highly stable operating characteristic and the size of the circuit chip is kept to a minimum. Moreover, by utilizing a quartz crystal vibrator wherein the frequency of same does not vary with changes in temperature, such as a thickness-shear quartz crystal vibrator, the accuracy of the electronic timepiece is further maintained. Accordingly, by forming the electronic timepiece with all of the circuitry with the exception of the quartz crystal vibrator being integrated on a single circuit chip, a small sized extremely accurate timepiece is provided.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

what is claimed is:

1. An electronic timepiece comprising oscillator means including a quartz crystal vibrator high frequency time standard having a resonant frequency of vibration of at least 500 KHz and an inverter stage coupled to said high frequency time standard, said oscillator means producing a high frequency time standard signal, divider means including a plurality of series-connected divider stages for producing a low frequency timekeeping signal in response to said high frequency time standard signal, and display means for displaying time in response to said timekeeping signal, a plurality of divider stages forming said divider means defining a high frequency divider portion, each of said plurality of divider stages being formed of at least one complementary coupled pair of P-channel and N-channel conductive field-effect transistors having a semiconductor-insulating substrate construction, said high frequency time standard signal being coupled to respectively commonly coupled drain and gate terminals of a P-channel and N-channel pair of transistors defining the inverter stage, and a feedback resistor means coupled in parallel with said quartz crystal vibrator, said oscillator means including capacitance means coupled between said commonly coupled gate and drain terminals of said P-channel and N-channel transistor pairs, and a reference potential, said inverter stage including source resistance means coupled intermediate the source electrode of each P-channel and N-channel transistor and a reference potential.

2. An electric timepiece as claimed in claim 1, wherein said quartz crystal vibrator high frequency time standard is a thickness-shear quartz crystal vibrator.

3. An electronic timepiece as claimed in claim 1, wherein each said source resistance means is an MOS element.

4. An electronic timepiece as claimed in claim 1, wherein said feedback resistance means is an MOS element.

5. An electronic timepiece as claimed in claim 1, wherein each of said source resistance means and feedback resistance means are MOS elements.

6. An electronic timepiece as claimed in claim 1, wherein said source resistance means is an MOS element formed by diffusing a low-concentration diffusion layer into a monocrystalline silicon substrate.

7. An electronic timepiece as claimed in claim 1, wherein said source resistance means is an MOS element formed by diffusing a low-concentration diffusion layer into a monocrystalline silicon substrate.

8. An electronic timepiece as claimed in claim 1, wherein said feedback resistance means is formed by forming a polycrystalline silicon layer on a semiconductor monocrystalline silicon substrate.

9. An electronic timepiece as claimed in claim 1, wherein said feedback resistance means is an MOS element wherein a polycrystalline layer is formed on a semiconductor monocrystalline silicon substrate.

10. An electronic timepiece as claimed in claim 1, wherein said respective capacitance means coupled between said common drain and gate terminals and said reference potential are formed of MOS elements.

11. An electronic timepiece as claimed in claim 10, wherein said oscillator means includes a tuning capacitor coupled intermediate said quartz crystal vibrator and one of said commonly coupled drain and gate terminals for adjusting the frequency of the high frequency time standard signal produced by said oscillator means.

12. An electronic timepiece as claimed in claim 9, wherein said oscillator means includes a variable capacitor coupled in parallel with said quartz crystal vibrator for adjusting the high frequency time standard signal produced by said oscillator means.

13. An electronic timepiece as claimed in claim 1, wherein said plurality of said series-connected divider stages forming said high frequency divider portion define a dynamic divider circuit, and wherein the remaining series-connected divider stages are formed in a static divider circuit to define a lower frequency divider portion.

14. An electronic timepiece as claimed in claim 13, wherein each of said divider stages comprising said dynamic divider circuit are formed of at least one complementary coupled pair of P-channel and N-channel conductive field-effect transistors having a semiconductor-insulating substrate construction.

15. An electronic timepiece as claimed in claim 13, and including frequency adjustment means coupled intermediate two of said series-connected divider stages, and being further coupled to receive said timekeeping signal produced by said divider stage and control signals, and in response thereto being adapted to adjust the division ratio of said divider means to thereby adjust the frequency of the low frequency timekeeping signal produced thereby.

16. An electronic timepiece as claimed in claim 15, wherein said high frequency time standard is a thickness-shear quartz crystal vibrator.

17. An electronic timepiece as claimed in claim 1, and including frequency adjustment means comprising a memory means for storing a predetermined count representative of actual time, and a comparator intermediate said memory means and divider means for comparing the count of said divider means and the count of said memory means, and in response to detecting coincidence in the respective counts thereof, resetting each of said divider stages to thereby adjust the frequency of said timekeeping signal produced by said divider means.

18. An electronic timepiece as claimed in claim 17, wherein said high frequency time standard is a thickness-shear quartz crystal vibrator.

* * * * *